(12) United States Patent
Kim

(10) Patent No.: US 11,049,542 B2
(45) Date of Patent: Jun. 29, 2021

(54) SEMICONDUCTOR DEVICE WITH MULTIPLE CHIPS AND WEAK CELL ADDRESS STORAGE CIRCUIT

(71) Applicant: SK hynix Inc., Icheon-si (KR)

(72) Inventor: Na Yeon Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/212,473

(22) Filed: Dec. 6, 2018

(65) Prior Publication Data

US 2019/0341099 A1 Nov. 7, 2019

(30) Foreign Application Priority Data

May 3, 2018 (KR) .................. 10-2018-0051348

(51) Int. Cl.
*G11C 11/406* (2006.01)
*G11C 7/10* (2006.01)
*G11C 11/408* (2006.01)
*H01L 23/16* (2006.01)

(52) U.S. Cl.
CPC ........ *G11C 11/40615* (2013.01); *G11C 7/109* (2013.01); *G11C 7/1063* (2013.01); *G11C 11/4087* (2013.01); *H01L 23/16* (2013.01)

(58) Field of Classification Search
CPC .......... G11C 11/40615; G11C 11/4087; G11C 7/1063; G11C 7/109; G11C 7/00; H01L 23/16
See application file for complete search history.

(56) References Cited

U.S. PATENT DOCUMENTS

| 5,332,922 | A | * | 7/1994 | Oguchi | .................... | G11C 5/00 |
| | | | | | | 257/723 |
| 5,796,669 | A | * | 8/1998 | Araki | .................... | G11C 7/1063 |
| | | | | | | 365/222 |
| 2010/0157656 | A1 | * | 6/2010 | Tsuchida | ............ | G11C 29/4401 |
| | | | | | | 365/148 |
| 2012/0008434 | A1 | | 1/2012 | Park | | |
| 2013/0223169 | A1 | | 8/2013 | Park | | |
| 2013/0279284 | A1 | * | 10/2013 | Jeong | .................... | G11C 11/402 |
| | | | | | | 365/222 |
| 2014/0085999 | A1 | * | 3/2014 | Kang | .................... | G11C 29/023 |
| | | | | | | 365/222 |
| 2014/0192583 | A1 | * | 7/2014 | Rajan | ........................ | G11C 7/10 |
| | | | | | | 365/63 |

FOREIGN PATENT DOCUMENTS

| KR | 101175248 B1 | 8/2012 |
| KR | 1020160117118 A | 10/2016 |

* cited by examiner

*Primary Examiner* — Sultana Begum
(74) *Attorney, Agent, or Firm* — William Park & Associates Ltd.

(57) ABSTRACT

A semiconductor device may include: a first chip, configured to receive a command and an address; and a second chip, configured to receive the command and the address. The first chip may include: a weak cell address storage circuit configured to store a weak cell address; a refresh control circuit configured to generate a refresh address based on the weak cell address, when the second chip is selected by a chip address; and a bank in which a refresh operation is performed by the refresh address.

16 Claims, 8 Drawing Sheets

_US 11,049,542 B2_

SEMICONDUCTOR DEVICE WITH MULTIPLE CHIPS AND WEAK CELL ADDRESS STORAGE CIRCUIT

CROSS-REFERENCES TO RELATED APPLICATION

The present application claims priority under 35 U.S.C. § 119(a) to Korean application number 10-2018-0051348, filed on May 3, 2018, in the Korean Intellectual Property Office, which is incorporated herein by reference in its entirety.

BACKGROUND

1. Technical Field

Various embodiments generally relate to a semiconductor device, and more particularly, to a technology relating to a refresh characteristic.

2. Related Art

In a semiconductor device, a memory cell for storing data includes a capacitor. Therefore, when a specific word line is selected, a transistor coupled to the word line is turned on to output the potential of a memory cell corresponding to the word line to a bit line.

The potential of the memory cell gradually deceases over time. That is, a capacitor used as a memory cell in the semiconductor device is discharged over time. Thus, the data stored in the memory cell may be lost. This is a fatal disadvantage of the memory device which is used to read/write data. Therefore, all devices which use the semiconductor device to secure the reliability of data necessarily perform a refresh operation to recharge memory cells.

A refresh operation is performed during a time allocated for the refresh operation, i.e. a refresh period. During the refresh operation, a normal operation is not performed. Therefore, since the time domain in which the normal operation can be performed is reduced, the entire operating speed of the semiconductor device may be reduced.

SUMMARY

Some embodiments are directed to a semiconductor device which includes a plurality of chips stacked therein. The semiconductor device can control any one chip of the plurality of chips to perform a read or a write operation while controlling another chip of the plurality of chips to perform a refresh operation.

For an embodiment in accordance with the present teachings, a semiconductor device may include: a first chip, configured to receive a command and an address; and a second chip, configured to receive the command and the address. The first chip may include: a weak cell address storage circuit configured to store a weak cell address; a refresh control circuit configured to generate a refresh address based on the weak cell address, when the second chip is selected by a chip address; and a bank in which a refresh operation is performed by the refresh address.

For another embodiment in accordance with the present teachings, a semiconductor device may include: a first plurality of chips coupled together through data transmission lines; and a second plurality of chips coupled together through data transmission lines. The first plurality of chips includes at least one master chip. The at least one master chip may include: a weak cell address storage circuit configured to store a weak cell address; a refresh control circuit configured to generate a refresh address based on the weak cell address when a slave chip, different from the master chip, is selected by a chip address; and a bank in which a refresh operation is performed based on the refresh address.

In a further embodiment in accordance with the present teachings, a semiconductor device performs a process. The process may include reading from or writing to a slave chip of the semiconductor device and refreshing a weak cell of a master chip of the semiconductor device during a time period when the semiconductor device is reading from or writing to the slave chip.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing exemplary embodiments consistent with this disclosure for a semiconductor device. The exemplary embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
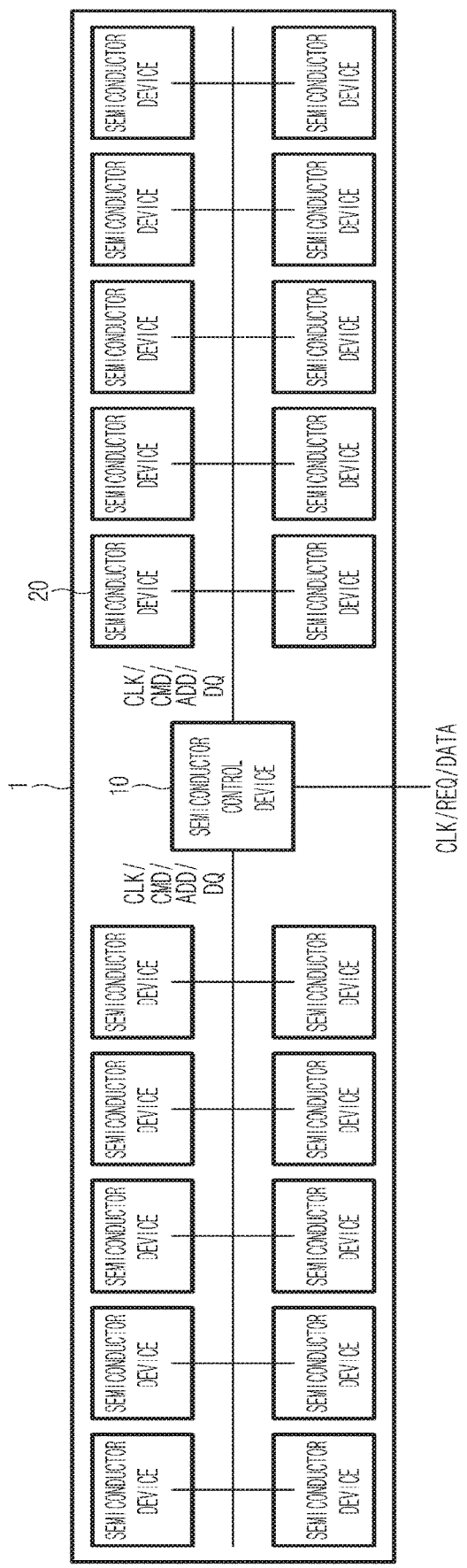
FIG. 1 shows a configuration diagram of a semiconductor system in accordance with an embodiment.

FIG. 1 illustrates a semiconductor system 1 in accordance with an embodiment.

Referring to FIG. 1, the semiconductor system 1 may include a semiconductor control device 10 and a plurality of semiconductor devices 20. FIG. 1 shows twenty semiconductor devices 20, among which ten of the semiconductor devices 20 are arranged to the left of the semiconductor control device 10 and ten of the semiconductor devices 20 are arranged to the right of the semiconductor control device 10. Different embodiments may include different numbers of semiconductor devices having different arrangements with respect to each other and/or with respect to a semiconductor control device. The semiconductor system 1 may also include a memory module, such as a dual in-line memory module (DIMM).

The semiconductor system 1 may exchange data DATA with a host (not illustrated). The host may include processors, such as a central processing unit (CPU), an application processor (AP), and/or a graphic processing unit (GPU).

The semiconductor control device 10 may relay communication between the host and a semiconductor device 20. The semiconductor control device 10 may receive a clock CLK, a request REQ, and data DATA from the host. The semiconductor control device 10 may also transmit data DQ from the semiconductor device 20 as the data DATA to the host.

The semiconductor control device 10 may provide the clock CLK, a command CMD, an address ADD, and the data DQ to the semiconductor device 20 in response to the request REQ from the host, and may control the semiconductor device 20 to perform a write or read operation. The semiconductor control device 10 may generate the clock CLK, the command CMD, the address ADD, and the data DQ and may provide the generated signals to the semiconductor device 20, in order to control the operation of the semiconductor device 20.

FIG. 1 shows the semiconductor control device 10 physically included within the semiconductor system 1. However, the semiconductor control device 10 may be included (embedded) in the processors of the host, such as the CPU, AP, and GPU, or implemented as one chip with the processors in the form of a SoC (System on Chip).

Figure 2:
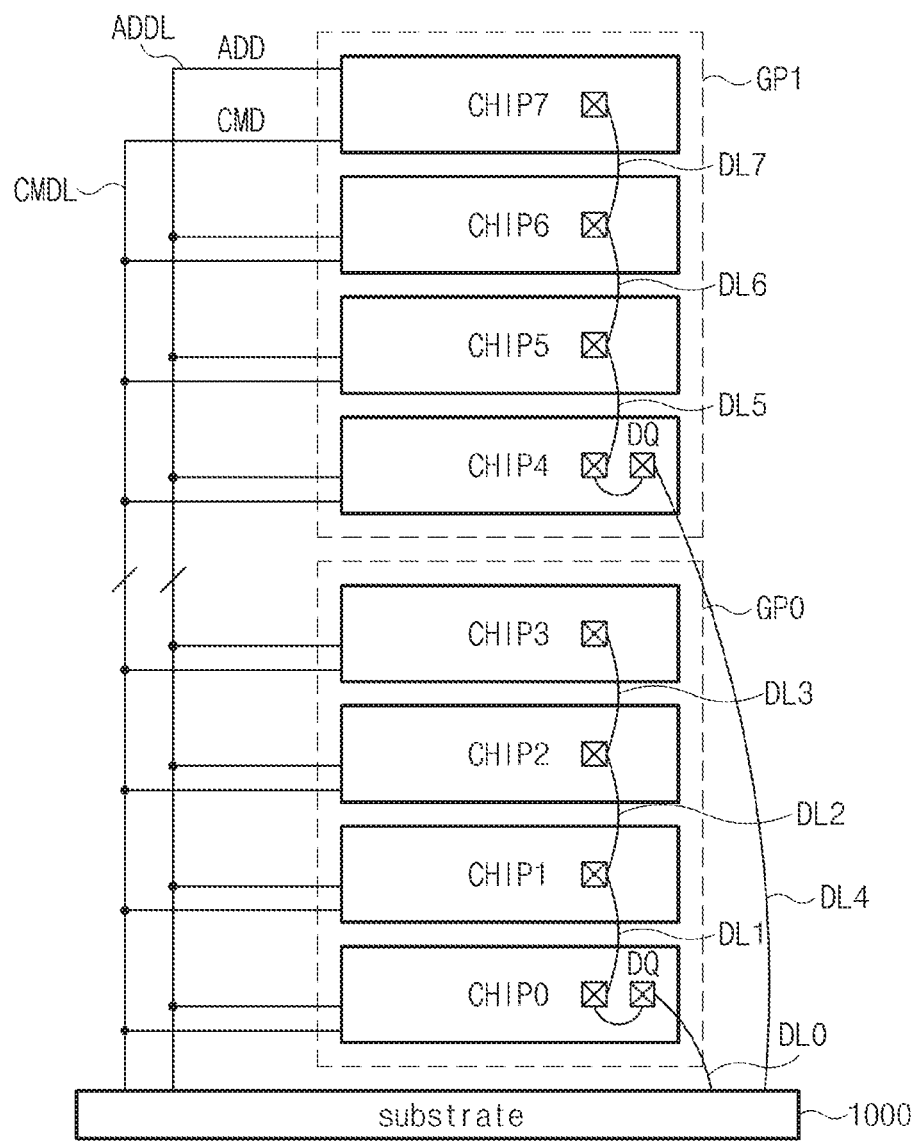
FIG. 2 shows a configuration diagram of the semiconductor device of FIG. 1.

FIG. 2 shows a configuration diagram of the semiconductor device 20 of FIG. 1.

Referring to FIG. 2, the semiconductor device 20 may include a plurality of chips CHIP0 to CHIP7 and a substrate 1000.

The plurality of chips CHIP0 to CHIP7 may be divided into a plurality of groups. In the illustrated embodiment, the plurality of chips CHIP0 to CHIP7 is divided into two groups, GP0 and GP1. The first to fourth chips CHIP0 to CHIP3 belong to the first group GP0, and the fifth to eighth chips CHIP4 to CHIP7 belong to the second group GP1. The first to eighth chips CHIP0 to CHIP7 may be stacked over the substrate 1000.

As indicated above, FIG. 2 illustrates that the semiconductor device 20 includes two groups, and each of the two groups includes four chips. However, the number of groups and the number of chips belonging to each of the group are not limited to the illustrated embodiment. For example, the semiconductor device 20 may include only one group or three or more groups, and the number of chips included in each of the groups may be vary.

The first to eighth chips CHIP0 to CHIP7 may be commonly coupled to a command transmission line CMDL for transmitting the command CMD and to an address transmission line ADDL for transmitting the address ADD. Each of the command CMD and/or the address ADD may contain a plurality of bits. Thus, the semiconductor system 1 may include a plurality of command transmission lines CMDL to transmit the multiple-bit command CMD and/or a plurality of address transmission lines ADDL to transmit the multiple-bit address ADD.

The substrate 1000 and the first chip CHIP0 may be coupled to each other through a first data transmission line DL0, and the first and second chips CHIP0 and CHIP1 may be coupled to each other through a second data transmission line DL1. The second and third chips CHIP1 and CHIP2 may be coupled to each other through a third data transmission line DL2, and the third and fourth chips CHIP2 and CHIP3 may be coupled to each other through a fourth data transmission line DL3.

The substrate 1000 and the fifth chip CHIP4 may be coupled to each other through a fifth data transmission line DL4, and the fifth and sixth chips CHIP4 and CHIP5 may be coupled to each other through a sixth data transmission line DL5. The sixth and seventh chips CHIP5 and CHIP6 may be coupled to each other through a seventh data transmission line DL6, and the seventh and eighth chips CHIP7 and CHIP8 may be coupled to each other through an eighth data transmission line DL7. That is, one chip CHIP0 of the first group GP0 may be coupled to the substrate 1000, and one chip CHIP4 of the second group GP1 may be coupled to the substrate 1000. The other chips CHIP1 to CHIP3 and CHIP5 to CHIP7 may be coupled in series to the chips CHIP0 and CHIP4, respectively, which are both coupled to the substrate 1000. The chips CHIP0 and CHIP4, which are directly coupled to the substrate 1000 and which directly transmit/receive the data DQ to/from the outside, may be defined as master chips. The other chips CHIP1 to CHIP3 and CHIP5 to CHIP7, to which the data DQ is transmitted through the master chips, may be referred to as slave chips.

The data DQ transmitted through the first to eighth data transmission lines DL0 to DL7 may have a plurality of bits. Therefore, the first to eighth data transmission lines DL0 to DL7 for transmitting the data DQ may each be implemented with a plurality of data transmission lines.

In the semiconductor device 20, the command transmission line CMDL, the address transmission line ADDL, and the data transmission lines DL1 to DL3 and DL5 to DL7 may be coupled by wire bonding or through-silicon vias (TSVs). Coupling the first to eighth chips CHIP0 to CHIP7 using wire bonding, in some instances, is more cost-effective than coupling the first to eighth chips CHIP0 to CHIP7 using TSVs.

The semiconductor device 20 having the above-described structure may operate as follows. Suppose that data stored in a specific chip of a specific semiconductor device 20 among the plurality of semiconductor devices 20 illustrated in FIG. 1, the third chip CHIP2, for example, is to be read by the semiconductor control device 10.

The semiconductor control device 10 may transmit the command CMD for the read operation through the command transmission line CMDL, and transmit the address ADD through the address transmission line ADDL. At this time, because the command transmission line CMDL and the address transmission line ADDL are coupled in common to the first to eighth chips CHIP0 to CHIP7, the command CMD and the address ADD may be transmitted to all of the first to eighth chips CHIP0 to CHIP7.

The data of the third chip CHIP2 may be read by a chip select signal (not illustrated) for selecting any one of the first to eighth chips CHIP0 to CHIP7. The data DQ stored in the third chip CHIP2 may be outputted in response to the command CMD and the address ADD, which are transmitted to the third chip CHIP2. The data DQ outputted from the third chip CHIP2 may be transmitted to the semiconductor control device 10 through the second chip CHIP1, the first chip CHIP0, and the substrate 1000 along the third data transmission line DL2, the second data transmission line DL1, and the first data transmission line DL0, respectively.

The first chip CHIP0 coupled to the substrate 1000 may serve to relay the data DQ when the data DQ is transmitted between the semiconductor control device 10 and the second to fourth chips CHIP1 to CHIP3. That is, the data DQ outputted from the second to fourth chips CHIP1 to CHIP3 may be transmitted to the semiconductor control device 10 through the first chip CHIP0, or the data outputted from the semiconductor control device 10 may be transmitted to any one of the second to fourth chips CHIP1 to CHIP3 through the first chip CHIP0. Furthermore, the data DQ can be directly transmitted between the first chip CHIP0 and the semiconductor control device 10.

In the present embodiment, information is transmitted between the semiconductor control device 10 and any one of the second to fourth chips CHIP1 to CHIP3. When information is transmitted between the semiconductor control device 10 and any one of the sixth to eighth chips CHIP5 to CHIP7, the transmission may be performed in a similar manner. In this case, the function of the first chip CHIP0 may be performed by the fifth chip CHIP4.

Specifically, when the data DQ is transmitted to any one of the sixth to eighth chips CHIP5 to CHIP7 from the semiconductor control device 10, the data DQ outputted from the semiconductor control device 10 may be transmitted to any one of the sixth to eighth chips CHIP5 to CHIP7 through the fifth chip CHIP4. Furthermore, when the data DQ is transmitted to the semiconductor control device 10 from any one of the sixth to eighth chips CHIP5 to CHIP7, the data DQ generated by any one of the sixth to eighth chips CHIP5 to CHIP7 may be transmitted to the semiconductor control device 10 through the fifth chip CHIP4.

When information is transmitted between the semiconductor control device 10 and the first chip CHIP0 or between the semiconductor control device 10 and the fifth chip CHIP4, the information may be directly transmitted through the data transmission line DL0 or DL4, respectively, coupled to the first or fifth chip CHIP0 or CHIP4.

Figure 3:
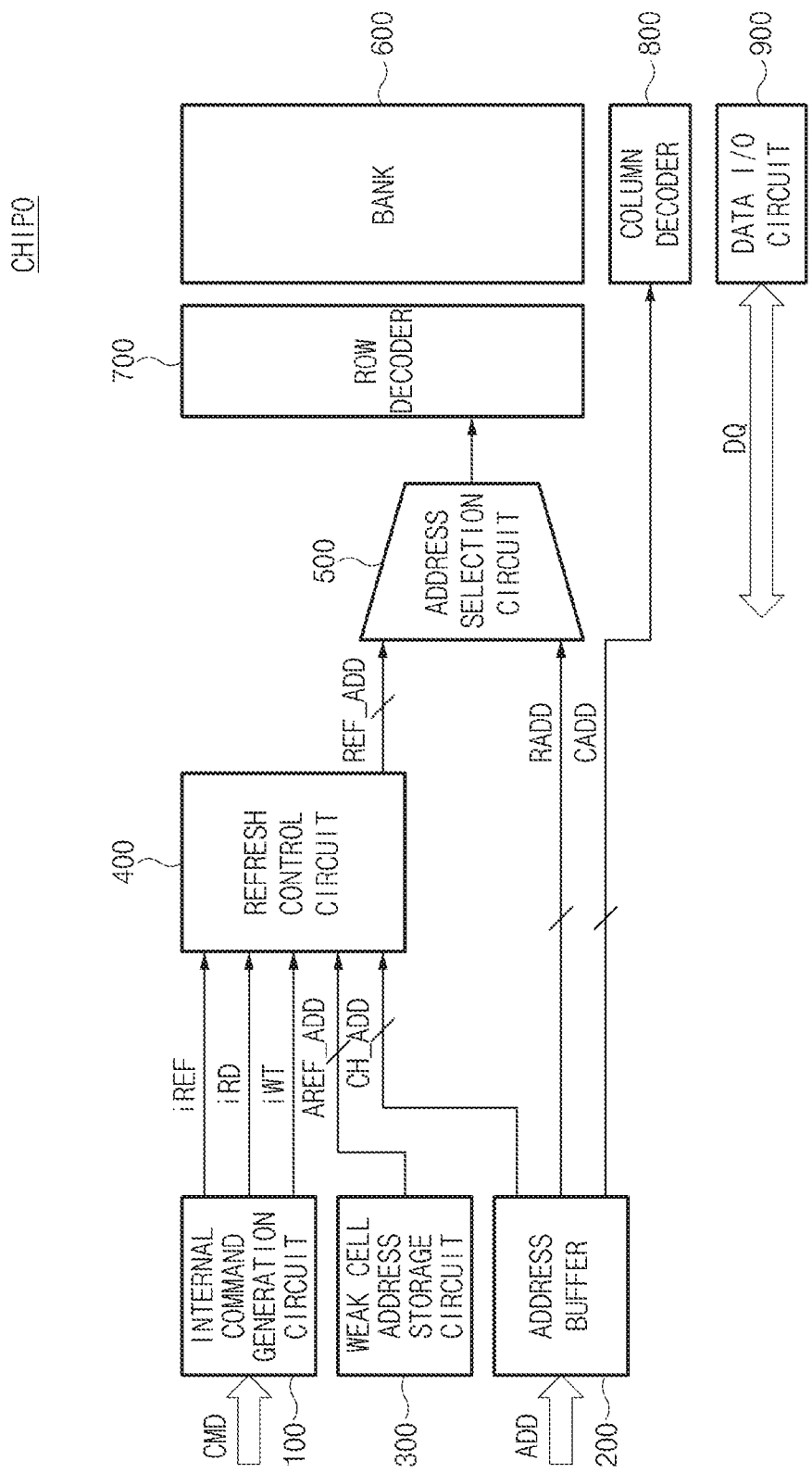
FIG. 3 shows a detailed configuration diagram of the first chip of FIG. 2.

FIG. 3 shows a detailed configuration diagram of the first chip CHIP0 of FIG. 2.

The first chip CHIP0 may include an internal command generation circuit 100, an address buffer 200, a weak cell address storage circuit 300, a refresh control circuit 400, an address selection circuit 500, a bank 600, a row decoder 700, a column decoder 800, and a data I/O circuit 900.

The internal command generation circuit 100 may generate an internal command signal by decoding the command CMD received from the semiconductor control device 10. For example, the internal command signal may include a refresh signal iREF, a read signal iRD and a write signal iWT.

The address buffer 200 may buffer the address ADD received from the semiconductor control device 10. The address ADD may include a chip address CH_ADD, a row address RADD, and a column address CADD. The chip address CH_ADD may be used to select any one of the semiconductor chips CHIP0 to CHIP7 and is also referred to as a chip select address or chip ID.

The weak cell address storage circuit 300 may store a weak cell address AREF_ADD at which an additional refresh operation as well as a normal refresh operation is to be performed. The weak cell address AREF_ADD may be used to select a weak cell which is to be additionally refreshed. The weak cell address storage circuit 300 may include an E-fuse array circuit, for example. In another embodiment, the weak cell address storage circuit 300 may include a nonvolatile memory such as a NAND flash memory, NOR flash memory, EPROM (Erasable Programmable Read Only Memory), EEPROM (Electrically Erasable Programmable Read Only Memory), FRAM (Ferroelectric RAM), or MRAM (Magnetoresistive RAM). The weak cell address storage circuit 300 may store only the weak cell address AREF_ADD, or may additionally store other control information for an operation of the semiconductor device, the other control information including repair information, information on internal voltage settings and input/output (I/O) timing information.

A weak cell may indicate a cell having a smaller charge retention time than a normal memory cell. Since a memory cell is discharged over time, a refresh operation may be performed to recharge the memory cell. Such a refresh operation may be performed at each preset refresh cycle based on the average charge retention time of the memory cells. The weak cell may have a charge retention time shorter than the refresh cycle. When only a typical refresh operation is performed, a data loss may occur in the weak cell.

The refresh control circuit 400 may generate a refresh address REF_ADD based on the read signal iRD, the write signal iWT, the refresh signal iREF, the chip address CH_ADD, and the weak cell address AREF_ADD. In another embodiment, the refresh control circuit 400 may generate the refresh address REF_ADD based on the read signal iRD, the write signal iWT, the chip address CH_ADD, and the weak cell address AREF_ADD without the refresh signal iREF.

For example, when the chip address CH_ADD indicates the chips CHIP1 to CHIP3 in the first group GP0 except the first chip CHIP0 and the read signal iRD or the write signal iWT is activated, the refresh control circuit 400 may generate the weak cell address AREF_ADD as the refresh address REF_ADD. Therefore, when a read operation or write operation is performed in the chips CHIP1 to CHIP3, the first chip CHIP0 may perform a refresh operation.

The address selection circuit 500 may select any one of the refresh address REF_ADD and the row address RADD, and may provide the selected address to the row decoder 700.

The bank 600 may include a plurality of memory cells coupled to a plurality of word lines and a plurality of bit lines. When a memory cell is selected by the row decoder 700 and the column decoder 800, a read or write operation or a refresh operation corresponding to the selected cell may be performed.

The row decoder 700 may decode any one of the refresh address REF_ADD and the row address RADD which are provided from the address selection circuit 500, and enable one or more of the plurality of word lines. Therefore, the bank 600 may perform a refresh operation on a word line corresponding to the refresh address REF_ADD.

The column decoder 800 may decode the column address CADD and select one or more of a plurality of column select lines.

The data I/O circuit 900 may transmit the data DQ inputted from the semiconductor control device 10 to the data I/O line during a write operation. On the other hand, the data I/O circuit 900 may output the data DQ transmitted from the data I/O line to the semiconductor control device 10.

FIG. 3 illustrates only the detailed configuration of the first chip CHIP0, but the other chips CHIP1 to CHIP7 may have the same configuration as the first chip CHIP0.

For example, when the chip address CH_ADD indicates the chips CHIP5 to CHIP7 in the second group GP1 except the fifth chip CHIP4 and the read signal iRD or the write signal iWT is activated, the fifth chip CHIP4 may generate the weak cell address AREF_ADD as the refresh address REF_ADD. Therefore, when a read operation or write operation is performed in the chips CHIP5 to CHIP7, the fifth chip CHIP4 may perform a refresh operation.

As illustrated in FIG. 2, the first to fourth chips CHIP0 to CHIP3 belonging to the first group GP0 may be coupled through the second to fourth data transmission lines DL1 to DL3, and the fifth to eighth chips CHIP4 to CHIP7 belonging to the second group GP1 may be coupled through the sixth to eighth data transmission lines DL5 to DL7. Therefore, when a read or write operation is performed in any one of the chips belonging to the same group, data may also be transmitted through the data transmission lines of the other chips. Therefore, the other chips may have an idle time in which a read or write operation cannot be performed. In the present embodiment, such an idle time may be used to perform a refresh operation. Therefore, since a separate time for only the refresh operation does not need to be allocated, the entire operating speed of the semiconductor device can be improved.

Figure 4:
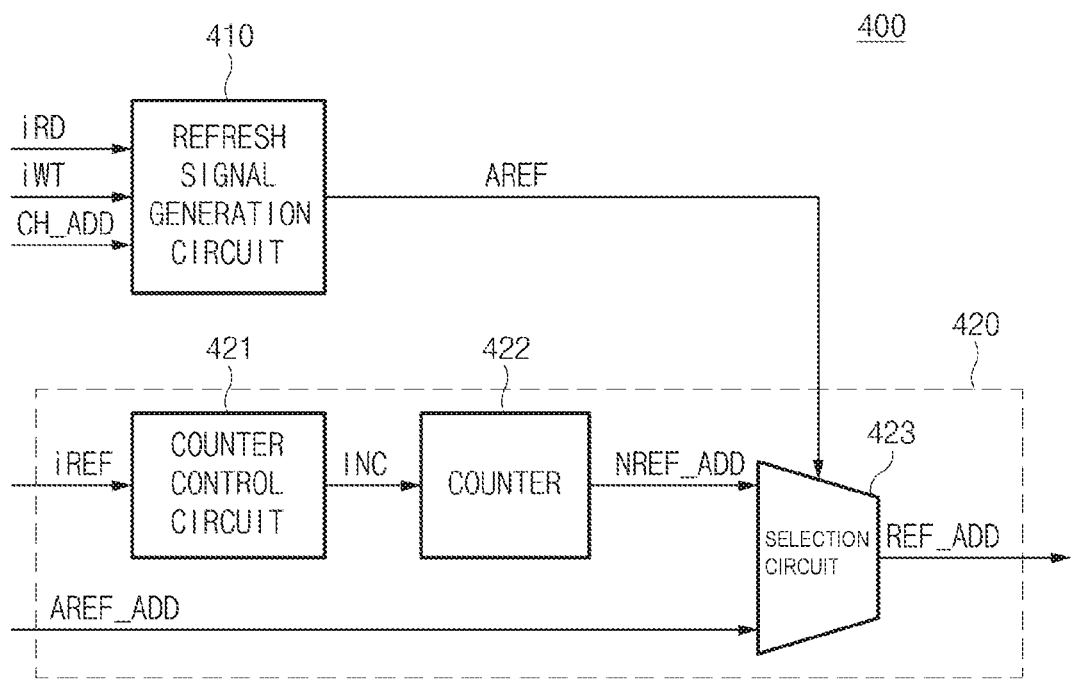
FIG. 4 illustrates the configuration of a refresh control circuit of FIG. 3.

FIG. 4 is a detailed configuration diagram of the refresh control circuit 400 of FIG. 3.

Referring to FIG. 4, the refresh control circuit 400 may include a refresh signal generation circuit 410 and a refresh address generation circuit 420.

The refresh signal generation circuit 410 may activate the refresh signal AREF when a read or write operation is performed in another chip instead of the corresponding chip. The refresh signal generation circuit 410 may generate the refresh signal AREF based on the read signal iRD, the write signal iWT, and the chip address CH_ADD.

The refresh signal generation circuit 410 may activate the refresh signal AREF when the read signal iRD or the write signal iWT is activated and the chip address signal CH_ADD indicates another chip. For example, the refresh signal generation circuit 410 of the first chip CHIP0 may activate the refresh signal AREF when the chip address signal CH_ADD indicates the second to eighth chips CHIP1 to CHIP7. In another embodiment, the refresh signal generation circuit 410 may activate the refresh signal AREF when the read signal iRD or the write signal iWT is activated and the chip address signal CH_ADD indicates another chip in the same group. For example, the refresh signal generation circuit 410 of the first chip CHIP0 may activate the refresh signal AREF when the chip address signal CH_ADD indicates the second to fourth chips CHIP1 to CHIP3 in the first group GP0.

The refresh address generation circuit 420 may output the weak cell address AREF_ADD as the refresh address REF_ADD when the refresh signal AREF is activated. The refresh address generation circuit 420 may generate the refresh address REF_ADD based on the refresh signal iREF and the weak cell address AREF_ADD.

The refresh address generation circuit 420 may include a counter control circuit 421, a counter 422, and a selection circuit 423.

The counter control circuit 421 may generate a counter increment signal INC based on the refresh signal iREF. The counter control circuit 421 may activate the counter increment signal INC at a predetermined time interval, when the refresh signal iREF is activated.

The counter 422 may generate a normal refresh address NREF_ADD based on the counter increment signal INC. The counter 422 may increase the counter value by 1 whenever the counter increment signal INC is inputted, and output the increased value as the normal refresh address NREF_ADD.

The selection circuit 423 may output one of the normal refresh address NREF_ADD and the weak cell address AREF_ADD as the refresh address REF_ADD based on the refresh signal AREF. For example, the selection circuit 423 may output the weak cell address AREF_ADD when the refresh signal AREF is activated, and may output the normal refresh address NREF_ADD when the refresh signal AREF is deactivated.

Figure 5:
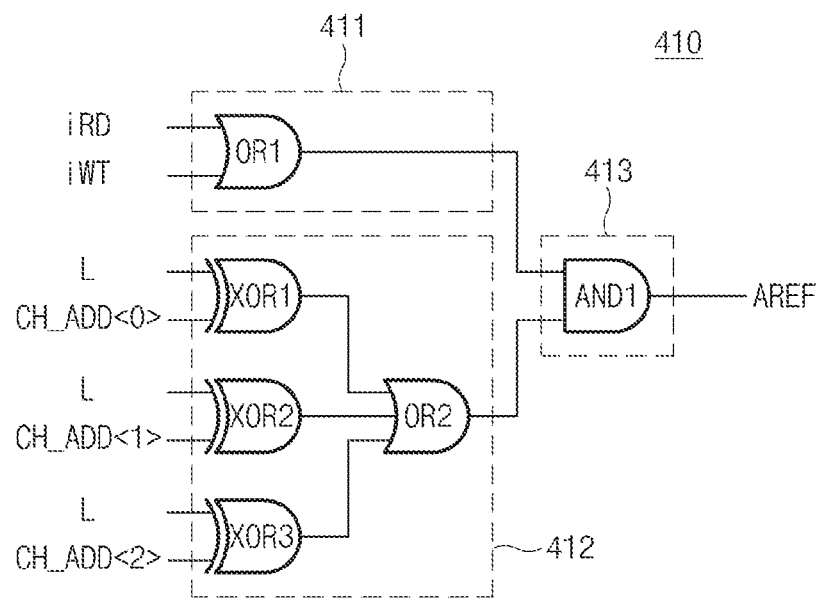
FIG. 5 illustrates an example of the refresh signal generation circuit of FIG. 4.

FIG. 5 illustrates an example of the refresh signal generation circuit 410 of FIG. 4.

FIG. 5 is based on the supposition that the chip address CH_ADD has three bits CH_ADD<0>, CH_ADD<1>, and CH_ADD<2> because the semiconductor device 20 includes eight chips CHIP0 to CHIP7. Then the chip addresses CH_ADD<2:0> of the first chip CHIP0, second chip CHIP1, third chip CHIP2, fourth chip CHIP3, fifth chip CHIP4, sixth CHIP5, seventh chip CHIP6, and eighth chip CHIP7 are set to "000," "001," "010," "011," "100," "101," "110," and "111," respectively.

The refresh signal generation circuit 410 may include a command determination circuit 411, a chip address determination circuit 412, and a final determination circuit 413.

The command determination circuit 411 may determine whether the read signal iRD or the write signal iWT is activated. The command determination circuit 411 may include an OR operator OR1. The OR operator OR1 may perform an OR operation on the read signal iRD and the write signal iWT.

The chip address determination circuit 412 may determine whether the chip address CH_ADD<2:0> indicates the other chips CHIP1 to CHIP7 instead of the first chip CHIP0 including the chip address determination circuit 412.

The chip address determination circuit 412 may include XOR operators XOR1 to XOR3 and an OR operator OR2. The XOR operator XOR1 may perform an XOR operation on a logic low level and the first bit CH_ADD<0> of the chip address. The XOR operator XOR2 may perform an XOR operation on a logic low level and the second bit CH_ADD<1> of the chip address. The XOR operator XOR3 may perform an XOR operation on a logic low level and the third bit CH_ADD<2> of the chip address. The OR operator OR2 may perform an OR operation on outputs of the XOR operators XOR1 to XOR3.

The final determination circuit 413 may activate the refresh signal AREF when the command determination circuit 411 determines that the read signal iRD or the write signal iWT is activated and when the chip address determination circuit 412 determines that the chip address CH_ADD<2:0> indicates the other chips CHIP1 to CHIP7. The final determination circuit 413 may include an AND operator AND1. The AND operator AND1 may generate the refresh signal AREF by performing an AND operation on output values of the OR operators OR1 and OR2.

Although the refresh signal generation circuit 410 has been described with reference to FIG. 5, the present embodiment is not limited thereto. Since the present embodiment is based on the supposition that the chip address CH_ADD<2:0> of the first chip CHIP0 is "000", a logic low level may be inputted to the XOR operators XOR1 to XOR3. However, the values inputted to the XOR operators XOR1 to XOR3 may be changed depending on the chip address CH_ADD of the chip including the refresh signal generation circuit 410.

Furthermore, although the three XOR operators XOR1 to XOR3 are used under the supposition that the chip address CH_ADD has three bits, the number of XOR operators may be changed depending on the number of bits contained in the chip address CH_ADD. FIG. 5 illustrates a circuit which activates the refresh signal AREF when the read signal iRD or the write signal iWT is activated and the chip address CH_ADD indicates the other chips CHIP1 to CHIP7 instead of the first chip CHIP0 is inputted. It is obvious to those skilled in the art that the illustrated circuit can be replaced with another equivalent circuit.

Figure 6:
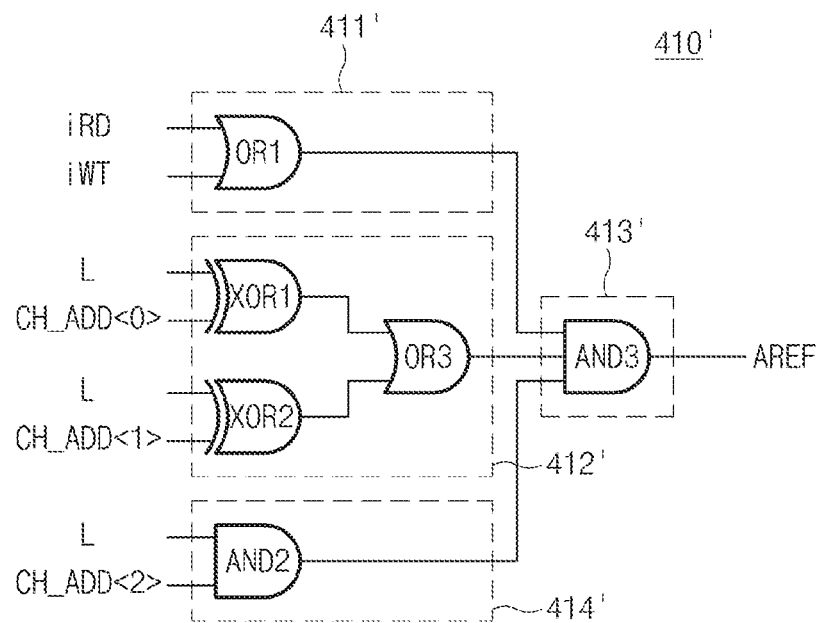
FIG. 6 illustrates another example of the refresh signal generation circuit of FIG. 4.

FIG. 6 illustrates another example of the refresh signal generation circuit 410 of FIG. 4. Reference numbers for the embodiment illustrated by FIG. 6 are followed by the prime symbol (') to distinguish them from the reference numbers for the embodiment illustrated by FIG. 5.

The refresh signal generation circuit 410' of FIG. 6 may activate the refresh signal AREF when the read signal iRD or the write signal iWT is activated and the chip address signal CH_ADD indicates another chip in the same group. For example, the refresh signal generation circuit 410' of the first chip CHIP0 may activate the refresh signal AREF when the chip address signal CH_ADD indicates the 20 second to fourth chips CHIP1 to CHIP3.

Referring to FIG. 6, the refresh signal generation circuit 410' may include a command determination circuit 411', a chip address determination circuit 412', a final determination circuit 413', and a group determination circuit 414'.

Because the command determination circuit 411' has the same configuration as the command determination circuit 411 of FIG. 5, a detailed description of the command determination circuit 411' is omitted here.

The chip address determination circuit 412' and the group determination circuit 414' may determine whether the chip address CH_ADD<2:0> indicates the other chips CHIP1 to CHIP3 in the same group.

The group determination circuit 414' may determine whether the third bit CH_ADD<2> of the chip address CH_ADD<2:0> indicates the same group GP0. The group determination circuit 414' may include an AND operator AND2. The AND operator AND2 may perform an AND operation on a logic low level and the third bit CH_ADD<2> of the chip address CH_ADD<2:0>. The chip address determination circuit 412' may determine whether the chip address CH_ADD<1:0> indicates the other chips CHIP1 to CHIP3. The chip address determination circuit 412' may include XOR operators XOR1 and XOR2 and an OR operator OR3. The XOR operator XOR1 may perform an XOR operation on a logic low level and the first bit CH_ADD<O> of the chip address CH_ADD<2:0>. The XOR operator XOR2 may perform an XOR operation on a logic low level and the second bit CH_ADD<1> of the chip address CH_ADD<2:0>. The OR operator OR2 may perform an OR operation on outputs of the XOR operators XOR1 and XOR2.

The final determination circuit 413' may activate the refresh signal AREF when the command determination circuit 411' determines that the read signal iRD or the write signal iWT is activated, the group determination circuit 414' determines that the third bit CH_ADD<2> of the chip address CH_ADD<2:0> indicates the same group GP0, and the chip address determination circuit 412' determines that the first and second bits CH_ADD<1:0> of the chip address CH_ADD<2:0> indicate the other chips CHIP1 to CHIP3. The final determination circuit 413' may include an AND operator AND3. The AND operator AND3 may generate the refresh signal AREF by performing an AND operation on output values of the OR operators OR1 and OR3 and the AND operator AND2.

In the refresh signal generation circuit 410', the values inputted to the XOR operators XOR1 and XOR2 and the AND operator AND2 may be changed depending on the chip address CH_ADD of the chip including the refresh signal generation circuit 410', as in the refresh signal generation circuit 410. The refresh signal generation circuit 410' may also be implemented with another equivalent circuit as well as the circuit illustrated in FIG. 6.

Figure 7:
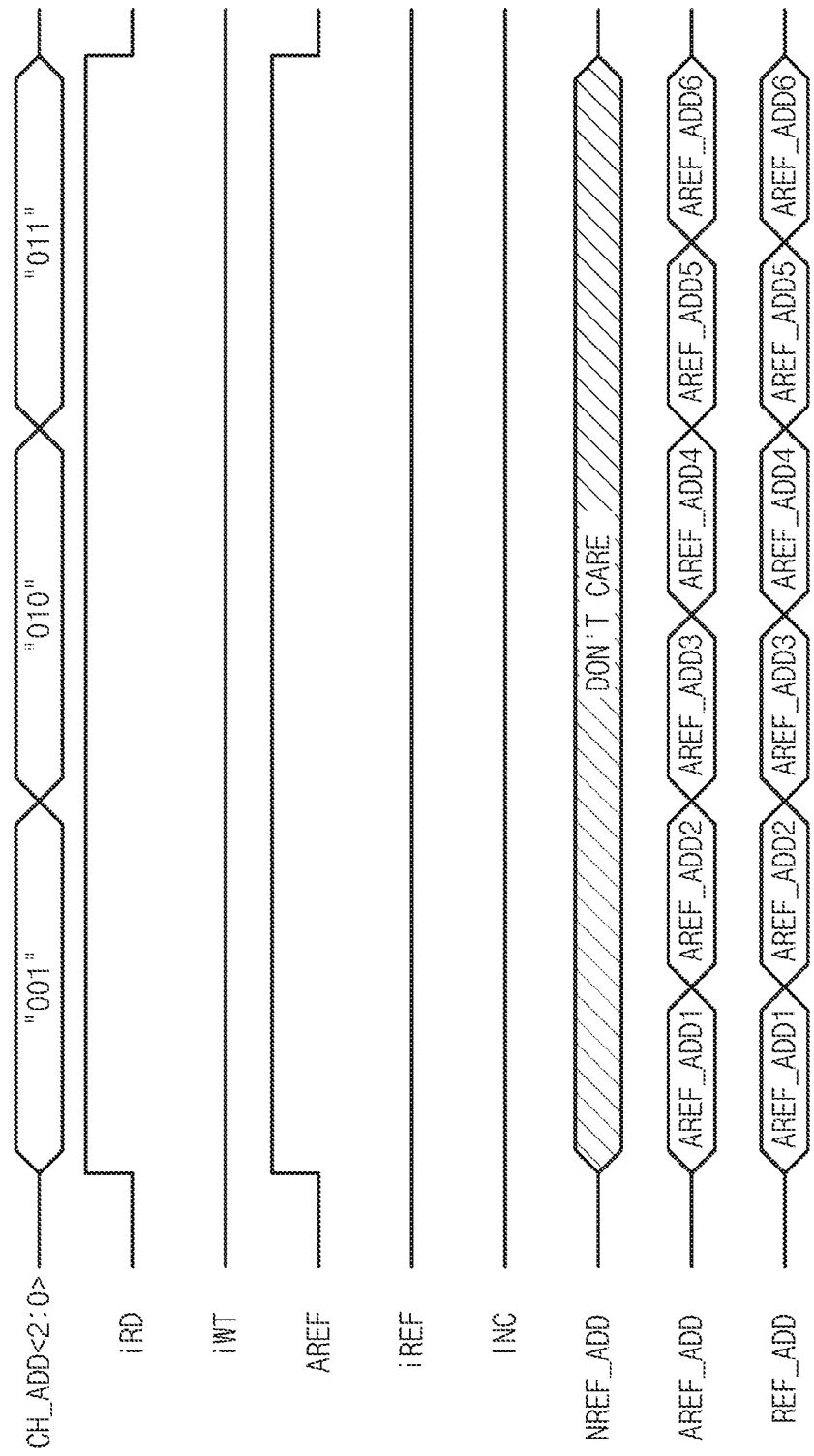
FIG. 7 shows a timing diagram illustrating some signals of the semiconductor device in accordance with the present embodiment.

FIG. 7 shows a timing diagram illustrating some of the signals of the semiconductor device 20, in accordance with the present embodiment.

FIG. 7 is based on the supposition that "001", "010," and "011" are sequentially inputted as the chip address CH_ADD<2:0> in the first group GP0. Referring to FIG. 2, the chip address CH_ADD<2:0> may indicate the second chip CHIP1 when the chip address CH_ADD<2:0> is "001", and indicate the third chip CHIP2 when the chip address CH_ADD<2:0> is "010," and indicate the fourth chip CHIP3 when the chip address CH_ADD<2:0> is "011."

The command CMD may be inputted with the chip address CH_ADD. The result obtained by decoding the command CMD through the internal command generation circuit 100 of FIG. 3 may be based on the supposition that the read signal iRD is activated, and the write signal iWT and the refresh signal iREF are deactivated.

Referring back to FIGS. 3 and 4, the refresh signal generation circuit 410 of the refresh control circuit 400 may activate the refresh signal AREF because the chip address CH_ADD<2:0> indicates the second, third, and fourth chips CHIP1, CHIP2, and CHIP3 instead of the first chip CHIP0, and the read signal iRD is activated.

The counter control circuit 421 of the refresh control circuit 400 may deactivate the counter increment signal INC because the refresh signal iREF is deactivated. Because the counter increment signal INC is deactivated, the normal refresh address NREF_ADD outputted from the counter 422 may have a don't-care value. The weak cell address storage circuit 300 may sequentially output weak cell addresses AREF_ADD1, AREF_ADD2, AREF_ADD3, AREF_ADD4, AREF_ADD5, and AREF_ADD6.

Because the refresh signal AREF is activated, the selection circuit 423 of the refresh control circuit 400 may sequentially indicate the weak cell addresses AREF_ADD1, AREF_ADD2, AREF_ADD3, AREF_ADD4, AREF_ADD5, and AREF_ADD6 as the refresh address REF_ADD.

Thus, while a read operation is performed in the second, third, and fourth chips CHIP1, CHIP2, and CHIP3, a refresh operation for the weak cell addresses AREF_ADD1, AREF_ADD2, AREF_ADD3, AREF_ADD4, AREF_ADD5, and AREF_ADD6 may be performed in the first chip CHIP0.

Figure 8:
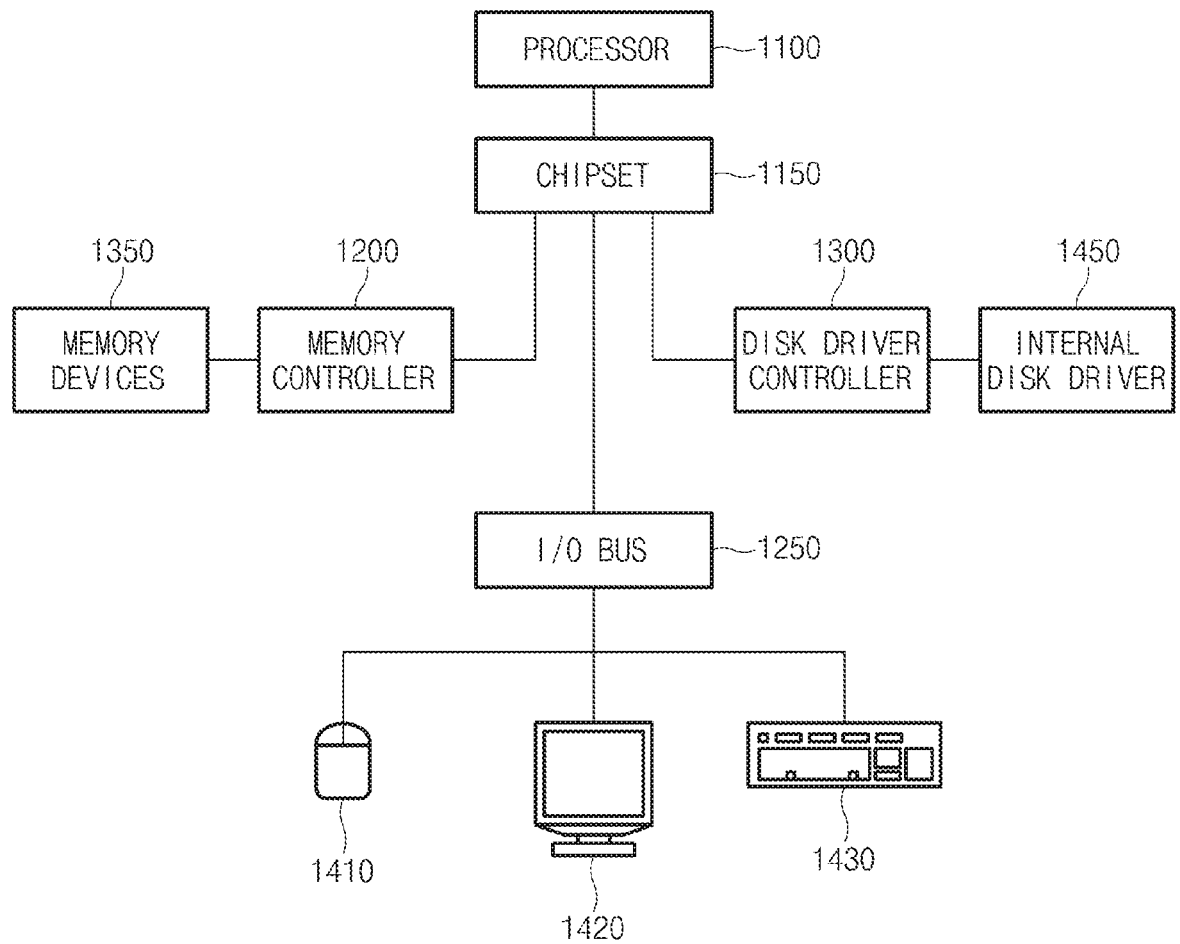
FIG. 8 shows a block diagram of an electronic system in accordance with an embodiment.

FIG. 8 illustrates an electronic system in accordance with an embodiment.

The semiconductor system or the semiconductor device of FIGS. 1 to 7 may be useful for designing other memory devices, such as processors and computer systems. For example, FIG. 8 illustrates an electronic system employing semiconductor systems or semiconductor devices in accordance with various embodiments. The electronic system may include one or more processors, for example, a CPU 1100. The processor, i.e. the CPU 1100, may be individually used or coupled to other processors. FIG. 8 illustrates only one processor, i.e. the CPU 1100, but it is obvious to those skilled in the art that the electronic system can include an arbitrary number of physical or logical processors or CPUs.

A chip set 1150 may be operably coupled to the processor, i.e. the CPU 1100. The chip set 1150 may serve as a communication path for signals between the processor and the other components of the electronic system. The other components of the electronic system may include a memory controller 1200, an input/output (I/O) bus 1250 and a disk driver controller 1300. According to the configuration of the electronic system, any one of a plurality of different signals may be transmitted through the chip set 1150. Furthermore, it is obvious to those skilled in the art that routing of signals across the electronic system can be easily changed without changing the essential elements of the electronic system.

As described above, the memory controller 1200 may be operably coupled to the chip set 1150. The memory controller 1200 may include the semiconductor control device 10 of FIG. 1 and one or more semiconductor devices described with reference to FIGS. 1 to 7. Therefore, the memory controller 1200 may receive a request from the processor, i.e. the CPU 1100, through the chip set 1150. In another embodiment, the memory controller 1200 may be integrated in the chip set 1150. The memory controller 1200 may be operably coupled to one or more memory devices 1350. In the present embodiment, the memory devices 1350 may include one or more semiconductor devices described with reference to FIGS. 1 to 7. The memory devices 1350 may correspond to any one of a plurality of industrial standard memory types including a single in-line memory module (SIMM) and a dual in-line memory module (DIMM). Furthermore, the memory devices 1350 may store both instructions and data, such that external data storage devices can be stably removed.

The chip set 1150 may also be coupled to the I/O bus 1250. The I/O bus 1250 may function as a communication path for signals from the chip set 1150 to the I/O devices 1410, 1420, and 1430. The I/O devices 1410 to 1430 may include a mouse 1410, a video display 1420, and a keyboard 1430. In order to communicate with the I/O devices 1410 to 1430, the I/O bus 1250 may employ any one of a plurality of communication protocols. In another embodiment, the I/O bus 1250 may be integrated in the chip set 1150.

The disk driver controller 1300 may be operably coupled to the chip set 1150. The disk driver controller 1300 may function as a communication path between the chip set 1150 and one internal disk driver 1450 or one or more external disk drivers 1450. The internal disk driver 1450 may store both of instructions and data, such that external data storage devices can be stably separated. The disk driver controller 1300 and the internal disk driver 1450 may communicate with each other or the chip set 1150, using any type of communication protocol with the I/O bus 1250, the communication protocols including all of the above-described protocols.

The electronic system described with reference to FIG. 8 may correspond to an example of the semiconductor system or the semiconductor device described with reference to FIGS. 1 to 7. For example, components in accordance with other embodiments, such as a mobile phone and digital camera, may be different from the embodiments illustrated in FIG. 8. The present disclosure is not limited to the above-described embodiments and the accompanying drawings. It is obvious to those skilled in the art that the present disclosure includes various substitutions and modifications without departing the scope of the present disclosure.

For reference, additional components may be included to describe the present disclosure in more detail, even though the additional components might not be directly related to the technical idea of the present disclosure. Furthermore, the configuration of an active high or an active low level indicating an active state of a signal or circuit may be changed depending on embodiments. Such circuit changes result in many different embodiments, which are easily inferred by those skilled in the art.

In accordance with present embodiments, because a separate time for a refresh operation does not need to be allocated, a semiconductor device can perform the refresh operation without affecting an operating speed.

What is claimed is:

1. A semiconductor device comprising:
   a first chip configured to receive a command and an address; and
   a second chip configured to receive the command and the address,
   wherein the first chip comprises:
      a weak cell address storage circuit configured to store a weak cell address;
      a refresh control circuit configured to generate a refresh address based on the weak cell address; and
      a bank in which a refresh operation is performed by the semiconductor device using the refresh address,
   wherein the refresh control circuit comprises:
      a refresh signal generation circuit configured to receive a chip address indicating that the second chip and not the first chip is performing a read or write operation and activate a refresh signal when the second chip and not the first chip is selected by the chip address; and
   a refresh address generation circuit configured to generate the refresh address based on the refresh signal,
      wherein the refresh signal generation circuit comprises:
         a command determination circuit configured to determine whether the command is a read command or write command;
         a chip address determination circuit configured to receive the chip address and determining whether the second chip is selected; and
         a final determination circuit configured to generate the refresh signal based on the determination results of the command determination circuit and the chip address determination circuit.

2. The semiconductor device of claim 1, wherein the first chip and the second chip receive the command through a command transmission line and receive the address through an address transmission line.

3. The semiconductor device of claim 1, wherein the first and second chips are stacked, and wherein the second chip receives data through the first chip.

4. The semiconductor device of claim 1, wherein the first and second chips are coupled to each other by at least one of a wire bond and a through-silicon via (TSV).

5. The semiconductor device of claim 1, wherein the refresh address generation circuit comprises:
   a counter control circuit configured to generate a counter increment signal in response to a refresh command;
   a counter configured to generate a normal refresh address based on the counter increment signal; and
   a selection circuit configured to selectively output the normal refresh address or a weak cell address based on the refresh signal.

6. The semiconductor device of claim 1, wherein the first chip further comprises an internal command generation circuit configured to generate an internal command signal by decoding the command.

7. The semiconductor device of claim 1, wherein the first chip further comprises an address buffer configured to generate the chip address by buffering the address.

8. The semiconductor device of claim 1, wherein the first chip further comprises an address selection circuit configured to select one of the refresh address and a row address.

9. The semiconductor device of claim 1, wherein the first chip comprises:

a row decoder configured to decode the refresh address and outputting the decoded address to the bank;

a column decoder configured to decode a column address of the address and outputting a decoded address to the bank; and a data input/output (I/O) circuit configured to transmit and receive data.

10. A semiconductor device comprising:

a first plurality of chips coupled together through data transmission lines; and a second plurality of chips coupled together through data transmission lines, wherein the first plurality of chips comprises at least one master chip and at least one slave chip, wherein a master chip of the at least one master chip comprises:

a weak cell address storage circuit configured to store a weak cell address;

a refresh control circuit configured to generate a refresh address based on the weak cell address; and a bank in which a refresh operation is performed based on the refresh address, wherein the refresh control circuit comprises:

a refresh signal generation circuit configured to receive a chip address indicating that the slave chip and not the master chip is performing a read or write operation and activate a refresh signal when the slave chip of at least one slave chip and not the master chip is selected by the chip address; and a refresh address generation circuit configured to generate the refresh address based on the refresh signal, wherein the refresh signal generation circuit comprises:

a command determination circuit configured to determine whether the command is a read command or write command;

a chip address determination circuit configured to determine whether the address is associated with a chip different from the chip including the refresh signal generation circuit;

a group determination circuit configured to receive the chip address and determining whether the chip address is associated with the first plurality of chips; and a final determination circuit configured to generate the refresh signal based on the determination results of the command determination circuit, the chip address determination circuit and the group determination circuit.

11. The semiconductor device of claim 10, wherein the first plurality of chips and the second plurality of chips share a command transmission line and an address transmission line.

12. The semiconductor device of claim 10, wherein the master chip has a data transmission line coupled to the outside.

13. The semiconductor device of claim 10, wherein the slave chip receives external data through the master chip.

14. The semiconductor device of claim 10, wherein the first plurality of chips are coupled together by at least one of a wire bond and a through-silicon via (TSV), wherein the second plurality of chips are coupled together by at least one of a wire bond and a through-silicon via (TSV).

15. The semiconductor device of claim 10, wherein the refresh address generation circuit comprises:

a counter control circuit configured to generate a counter increment signal in response to a refresh command;

a counter configured to generate a normal refresh address based on the counter increment signal; and a selection circuit configured to selectively output the normal refresh address or the weak cell address based on the refresh signal.

16. The memory device of claim 10, wherein the master chip comprises:

an internal command generation circuit configured to generate an internal command signal by decoding the command;

an address buffer configured to generate the chip address by buffering the address;

an address selection circuit configured to select any one of the refresh address and a row address;

a row decoder configured to decode the refresh address and outputting the decoded address to the bank;

a column decoder configured to decode a column address of the address and outputting a decoded address to the bank; and a data input and output (I/O) circuit configured to transmit and receive the data.

* * * * *